(12) United States Patent
Tanielian et al.

(10) Patent No.: US 7,114,252 B2
(45) Date of Patent: Oct. 3, 2006

(54) LARGE SCALE SIMULTANEOUS CIRCUIT ENCAPSULATING APPARATUS

(75) Inventors: Aram Tanielian, Rancho Palos Verdes, CA (US); Garo W. Tanielian, Rolling Hills, CA (US); Keiichi Nakanishi, Saitama-ken (JP)

(73) Assignee: Toko, Inc., Tokyo (JP)

( * ) Notice: Subject to any disclaimer, the term of this patent is extended or adjusted under 35 U.S.C. 154(b) by 20 days.

(21) Appl. No.: 10/871,717

(22) Filed: Jun. 17, 2004

(65) Prior Publication Data

US 2005/0278946 A1 Dec. 22, 2005

(51) Int. Cl.
*H01K 3/10* (2006.01)

(52) U.S. Cl. .......................... 29/852; 29/825; 29/846; 174/259

(58) Field of Classification Search .................. 29/825, 29/832, 846, 852; 174/259
See application file for complete search history.

(56) References Cited

U.S. PATENT DOCUMENTS

| 6,060,818 | A | 5/2000 | Ruby et al. |
| 6,377,137 | B1 | 4/2002 | Ruby |
| 6,384,697 | B1 | 5/2002 | Ruby |
| 6,399,425 | B1 * | 6/2002 | Brand et al. ................. 438/126 |
| 6,424,237 | B1 | 7/2002 | Ruby et al. |
| 6,441,702 | B1 | 8/2002 | Ella et al. |
| 6,456,173 | B1 | 9/2002 | Ella et al. |
| 6,469,597 | B1 | 10/2002 | Ruby et al. |
| 6,472,954 | B1 | 10/2002 | Ruby et al. |
| 6,480,074 | B1 | 11/2002 | Kaitila et al. |
| 6,483,229 | B1 | 11/2002 | Larson, III et al. |
| 6,486,751 | B1 | 11/2002 | Barber et al. |
| 6,542,054 | B1 | 4/2003 | Aigner et al. |
| 6,566,979 | B1 | 5/2003 | Larson, III et al. |
| 6,617,249 | B1 | 9/2003 | Ruby et al. |
| 6,657,517 | B1 | 12/2003 | Barber et al. |
| 6,662,419 | B1 | 12/2003 | Wang et al. |
| 6,711,792 | B1 | 3/2004 | Itasaka |
| 6,812,068 | B1 * | 11/2004 | Brand et al. ................. 438/126 |
| 2003/0098631 | A1 | 5/2003 | Ruby et al. |

OTHER PUBLICATIONS

Paper by W. Esashi et all titled "Anodic Bonding for Integrated Capacitive Sensors" a paper in a conference titled IEEE Micro Electro Mechanical Systems: An Investigation of Micro Strucvtures, Sensors, Actuators, Machines and Robots; pp. 43-48.* eds Benecke et al, IEEE, Conference was held Feb. 4-7, 1992 in Travemunde, Germany.*

* cited by examiner

*Primary Examiner*—Carl J. Arbes
(74) *Attorney, Agent, or Firm*—Gene Scott, Patent Law & Venture Group

(57) ABSTRACT

A plurality of individual circuits are formed on a substrate. Each of the individual circuits is formed with electrical contacts. A spacer is sealed onto the substrate, the spacer peripherally enclosing each of the individual circuits while exposing the conductive contacts. A cover is positioned over the spacer is and integral with it. First conductive feedthroughs penetrate the cover, the first conductive feedthroughs positioned peripheral to each of the individual circuits. Conductive pads are formed on a bottom surface of the cover, the conductive pads in electrical continuity with the conductive contacts of the individual circuits. Conductive paths are formed on the bottom surface of the cover, the conductive paths each joining at least one of the conductive pads with at least one of the first conductive feedthroughs thereby establishing electrical continuity between the individual circuits and the first conductive feedthroughs so as to establish pin-outs.

5 Claims, 3 Drawing Sheets

LARGE SCALE SIMULTANEOUS CIRCUIT ENCAPSULATING APPARATUS

INCORPORATION BY REFERENCE

Applicant(s) hereby incorporate herein by reference, any and all U.S. patents and U.S. patent applications cited or referred to in this application.

BACKGROUND OF THE INVENTION

1. Field of the Invention

This invention relates generally to microdevice packaging and encapsulating packages and methods of fabrication and sealing of such hardware, and more particularly to a packaging device and method for simultaneous large scale packaging of plural circuit devices at one time including the step of providing a package separation technique having convenient electrodes on plural surfaces of the individual devices.

2. Description of Related Art

The following art defines the present state of this field:

Karp, U.S. Pat. No. 3,349,481 describes the process of manufacturing sealed micro-circuitry modules including networks of integrated deposited circuit elements, comprising the steps of: (a) providing circuit packaging members including an insulating glass substrate having a raised ridge surrounding a circuit-element-receiving cavity recessed below the ridge to a depth at least equaling the height of the elements to be deposited; (b) applying to the substrate spaced conductive metalized connector films, each having an external portion extending to a location outside of said packaging members for the purpose of providing external connections for the network elements when deposited within the cavity, and each extending into a location within the circuit-element-receiving cavity; (c) firing the films onto the surface to which they are applied; (d) subsequently depositing circuit-element networks in the recessed cavity including depositing portions of elements is overlapping relationship with said connector film portions located within the cavity; and (e) sealing the circuitry by applying a cover member over the recessed cavity and bonding it to the raised ridge while leaving exposed at least part of said external portion of each connector film.

Dougherty, U.S. Pat. No. 4,193,082 describes the coating of a conductor pattern on dielectric green sheets to a common edge thereof with stacking or superimpositioning together of a plurality of sheets to enclose the conductor pattern followed by sintering, with the edge side of the fired body having the exposed end terminations becoming the actual face of the body on which a semiconductor device is mounted in electrical circuit connection to respective ones of the common end terminations of the conductor runs. The opposite or distal ends of the conductor runs may be fanned out to the opposite edge of side of the fired body in increased spaced relationship to each other.

Gogal, U.S. Pat. No. 4,288,841 describes a semiconductor device including a double cavity semiconductor chip carrier 100 which comprises a multilayer ceramic sandwich structure having a pair of semiconductor chip receiving cavities in the opposite faces thereof. The package enables mounting and electrical interconnection of a pair of semiconductor integrated circuit chips in a package of the same size as that for a single chip and having somewhat greater thickness. External terminals 93 on an outside face of the carrier are connected selectively by metallization paths 44, 53, 55, 83 integral with the carrier to chip mounting pads 41, 51 and to internal terminals 28 within the carrier. The internal terminals are disposed peripherally with respect to the chip cavities and adapted for interconnection with chip contact pads 26. Thus, a pair of unlike semiconductor integrated circuits can be interconnected in accordance with different patterns within a single package.

Gilbert et al., U.S. Pat. No. 4,551,746 describes a carrier apparatus for mounting logic components on the surface of a circuit board. The carrier apparatus includes a housing structure defining top and bottom surfaces and further defining a cavity in the bottom surface for receipt of a logic component. A recessed cover portion is attached to the housing so as to enclose the cavity thereby effectively sealing the logic component in the housing. The carrier apparatus includes means for mounting the housing on a circuit board such that the cover does not make contact with the surface of the circuit board. The housing further includes means for electrically interconnecting the logic component to the circuit board. In yet another embodiment, a carrier apparatus for mounting logic components on the surface of a circuit board is disclosed which utilize ground and voltage planes together with alternating signal and AC ground traces so as to effectuate coplanar/strip-line and coplanar/microstrip transmission line environments along portions of the signal traces. Consequently, this results in signal lines having a controlled impedance environment and minimized crosstalk between neighboring signal leads lying in the same plane.

Bitaillou et al., U.S. Pat. No. 4,830,264 describes a method of forming solder terminals for a pinless module, preferably for a pinless metalized ceramic module. The method is comprised of the following steps: forming a substrate having a pattern of conductors formed onto its top surface and preformed via-holes extending from the top to bottom surface; applying a droplet of flux at least one of said preformed via-hole openings of the bottom surface of said substrate to fill said via-holes with flux by capillarity and form a glob of flux at the bottom openings; applying a solder preform, i.e. solder balls on each glob of flux to which it will adhere, the volume of the preform being substantially equal to the inner volume of the via hole plus the volume of the bump to be formed; heating to cause solder reflow of the solder preform to fill the via-hole and the inner volume of the eyelet with solder; and, cooling below the melting point of the solder so that the molten solder solidifies to form solder terminals at the via-hole locations while forming solder columns in the via-holes. The resultant pinless metalized ceramic module has connections between the I/O's of the module interfacing with the next level of packaging, (i.e., printed circuit boards), that consist of integral solder terminals. Each integral solder terminal comprises a column in the vias of the metalized ceramic substrate, a mound of solder at the top surface of the substrate and spherical solder bumps on the bottom level for making interconnections with the next level of packaging.

Ehlert et al., U.S. Pat. No. 5,168,344 describes hermetic package designs for HDMI substrates. The designs for a hermetically sealed, perimeter-leaded package may have the following features: a) a flat monolithic dielectric base, the base having a flat upper surface and a flat lower surface; b) a zone on the upper surface, in which zone the HDMI device would reside; c) a seal ring surrounding the zone; d) a cover adapted to be hermetically sealed to the seal ring, thereby protecting the HDMI device located in the zone; e) a plurality of conductive vias (inner vias) extending from the upper surface inside said zone downwardly toward the lower surface; f) a plurality of perimeter conductive lead pads located on or in the upper surface about the perimeter of the zone inside the seal ring; wherein (1) the perimeter lead pads are electrically connected to the inner vias, and (2) the inner vias are electrically connected to a surface of the base outside the zone.

Sugimura, U.S. Pat. No. 6,346,432 describes external connection terminals on side surfaces, a back surface, or both the side surfaces and the back surface of a semiconductor element, especially an optical element such as an image sensor, a solid state imaging device, etc. The external connection terminals are connected electrically to an integrated circuit of the optical element via wirings. The wirings are connected electrically to electrical measuring electrodes in the course of wafer process, but the electrical measuring electrodes are disconnected from the wirings after the electrical measurement has been completed. The electrical measuring electrodes are formed on dicing lines and then removed at the same time when dicing process is executed. The external connection terminals are connected to the wirings from which the electrical measuring electrodes are disconnected.

Pace, U.S. Pat. No. 6,388,264 describes a compact, rugged, optocoupler which is a self-contained package. The optocoupler has a photon emitter mounted on the conductive pattern of a first, inorganic substrate, and a photon detector mounted on the conductive pattern of a second, inorganic, insulating substrate. The first and second substrates are bonded to an inorganic frame to form a cell containing a photon emitter opposite a photon detector. The first and second substrates and the frame also constitute the walls of the self-contained package. The optocoupler package may be manufactured with one or multiple cells in a package.

Mayo Foundation, WO 84/01470 describes a carrier apparatus for mounting logic components on the surface of a circuit board. The carrier apparatus includes a housing structure defining top and bottom surfaces and further defining a cavity in the bottom surface for receipt of a logic component. A recessed cover portion is attached to the housing so as to enclose the cavity thereby effectively sealing the logic component in the housing. The carrier apparatus includes means for mounting the housing on a circuit board such that the cover does not make contact with the surface of the circuit board. The housing further includes means for electrically interconnecting the logic component to the circuit board. In yet another embodiment, a carrier apparatus for mounting logic components on the surface of a circuit board is disclosed which utilize ground and voltage planes together with alternating signal and AC ground traces so as to effectuate coplanar/strip-line and coplanar/microstrip transmission line environments along portions of the signal traces. Consequently, this results in signal lines having a controlled impedance environment and minimized crosstalk between neighboring signal leads lying in the same plane.

Motorola, Inc., WO 02/41397 describes a low profile integrated module that is fabricated to include sheets of material, such as ceramic or PCB, fixed together and including a via extending through at least one of the plurality of sheets from the lower module surface partially to the upper module surface and in a side module surface. The via is filled with conductive material. The module is then mounted on a supporting substrate having a solder pad on the mounting surface with an area greater than the lower surface of the via. The lower surface of the via is positioned adjacent the upper surface of the mounting pad and soldered so that solder wicks up' the via along the side module surface.

Our prior art search with abstracts described above teaches: a semiconductor element having external connection terminals and a method of manufacturing the element, a double cavity semiconductor chip carrier, a ceramic electronic package design, an integrated circuit sealing method and structure, a multi-layer dielectric structure, an hermetically sealed optocoupler package, a method of forming solder terminals on a pin-less ceramic module, a leadless chip carrier apparatus providing an improved transmission line environment with improved heat dissipation, a leadless chip carrier for logic components, and low profile integrated module interconnects. However, the prior art fails to teach a large scale integrated circuit devices package and method of making and using the package for sealing a plurality of devices at one time and a technique for dicing for obtaining the devices after encapsulation wherein the devices have external connects available to top, side and bottom surfaces. The present invention fulfills these needs and provides further related advantages as described in the following summary.

SUMMARY OF THE INVENTION

The present invention teaches certain benefits in construction and use which give rise to the objectives described below.

In a best mode preferred embodiment of the present invention, a plurality of individual circuits are formed on a substrate. Each of the individual circuits is formed with electrical contacts. A spacer is sealed onto the substrate, the spacer peripherally enclosing each of the individual circuits while exposing the conductive contacts. A cover is positioned over the spacer is and integral with it. First conductive feedthroughs penetrate the cover, the first conductive feedthroughs positioned peripheral to each of the individual circuits. Conductive pads are formed on a bottom surface of the cover, the conductive pads in electrical continuity with the conductive contacts of the individual circuits. Conductive paths are formed on the bottom surface of the cover, the conductive paths each joining at least one of the conductive pads with at least one of the first conductive feedthroughs thereby establishing electrical continuity between the individual circuits and the first conductive feedthroughs so as to establish pin-outs. Upon dicing of the substrate with the spacer and cover on it, the conductive materials of the individual devices in the cover holes is exposed for interconnection of the device with an external circuit.

A primary objective of one embodiment of the present invention is to provide an apparatus and method of use of such apparatus that yields advantages not taught by the prior art.

Another objective is to assure that an embodiment of the invention is capable of encapsulating a large number of planar devices at one time with a single package.

A further objective is to assure that an embodiment of the invention is capable of providing conductive surface on a top, a bottom and the sides of the package.

A still further objective is to assure that an embodiment of the invention is may be diced after encapsulation of the large number of devices.

Other features and advantages of the embodiments of the present invention will become apparent from the following more detailed description, taken in conjunction with the accompanying drawings, which illustrate, by way of example, the principles of at least one of the possible embodiments of the invention.

BRIEF DESCRIPTION OF THE DRAWINGS

The accompanying drawings illustrate at least one of the best mode embodiments of the present invention. In such drawings.

DETAILED DESCRIPTION OF THE INVENTION

The above described drawing figures illustrate the present invention in at least one of its preferred, best mode embodiments, which is further defined in detail in the following description. Those having ordinary skill in the art may be able to make alterations and modifications in the present invention without departing from its spirit and scope. Therefore, it must be understood that the illustrated embodiments have been set forth only for the purposes of example and that they should not be taken as limiting the invention as defined in the following.

Figure 1:
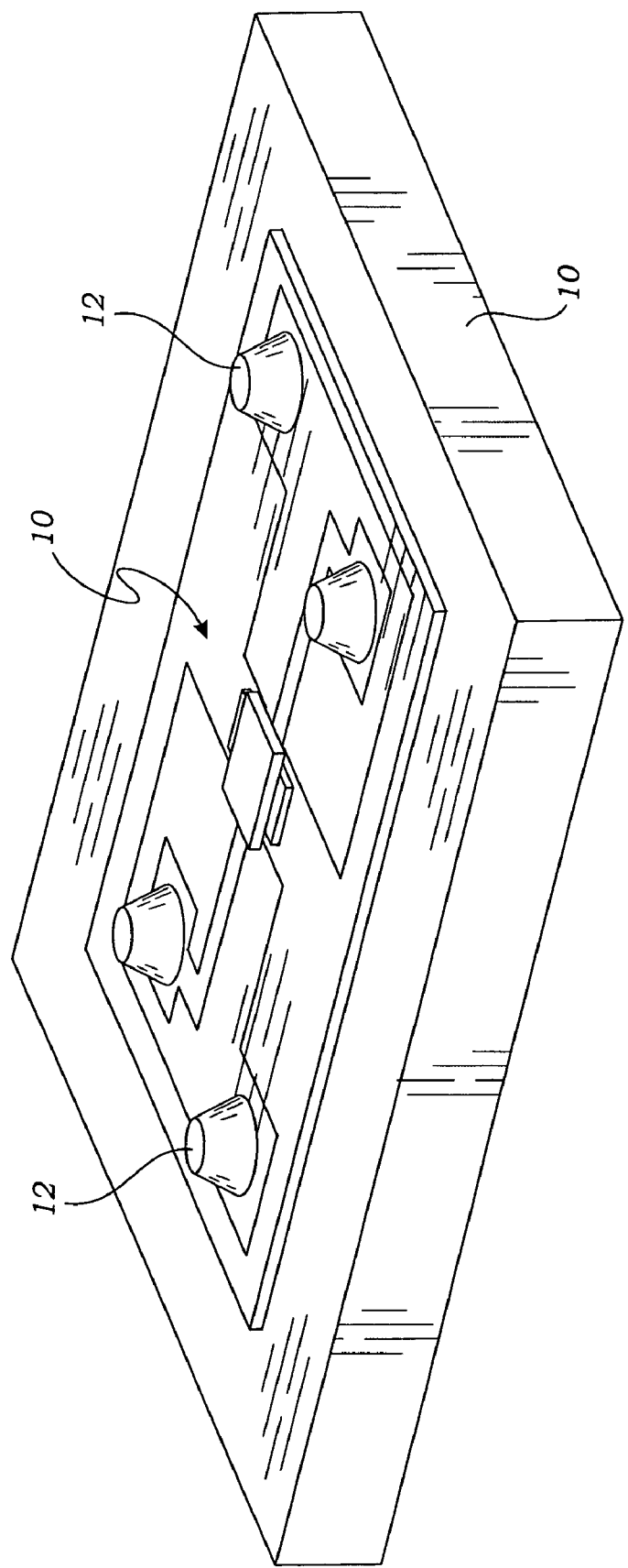
FIG. 1 is a perspective view of a device used with the present invention apparatus for packing thereof using the method of the present invention and showing four cone frustum-shaped ball bonds extending upwardly therefrom.
Figure 2:
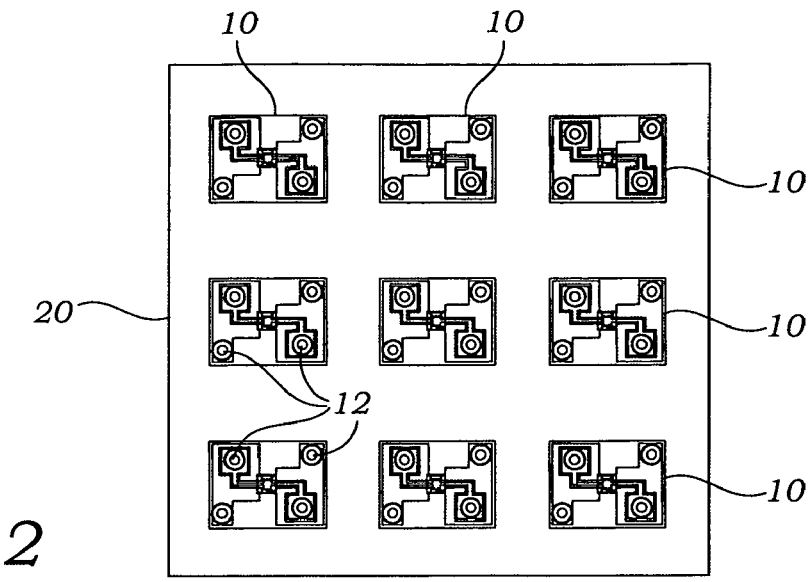
FIG. 2 is a top plan view of a substrate upon which a plurality of the devices of FIG. 1 are formed, with the four ball bonds shown in each of the devices as concentric circles.

In one aspect of a best mode embodiment of the present invention an apparatus simultaneously encapsulates a plurality of individual circuits 10 which were previously formed on a substrate 20. For instance, the circuits 10 may be planar microcircuits such as LSI or VLSI planar devices formed using thin him techniques in a conventional manner on a silicon wafer which acts as the substrate 20. Alternately, as only one other example of a very large number of possibilities, the circuits 10 may be thick film devices formed on ceramic or glass substrates 20. Conductive contacts 12 are formed on each of the individual circuits 10 as shown in FIGS. 1 and 2 and extend away from substrate 20 by approximately 85 microns. A spacer 30, shown in FIG. 3, and typically 60 micron thick, is sealed onto to substrate 20, the spacer 30 peripherally enclosing each of die individual circuits 10 while exposing the conductive contacts 12. It is noted that the spacer 30 has apertures 31 which are in registration with the individual circuits 10, and arc slightly larger then the circuits 10 for clearance around them. A cover 40, shown in FIG. 4, is positioned over the spacer 30 and is made integral therewith. Plural first conductive feedthroughs 42 of approximately 0.010 inches diameter, penetrate the cover 40 and, with the cover 40 in place over the spacer 30, the feedthroughs 42 are positioned peripherally to each of the individual circuits 10, and this is clearly shown in FIG. 3. Each of these feedthroughs 42 is typically made by boring or punching a hole in the cover 40 and filing it with a conductive material such as gold or copper To accommodate this, the bored holes are typically plated through holes or thick film screen holes as is well known in the art. Conductive pads 44 of approximately 0.010 inches diameter are deposited preferably by vacuum screen printing on a bottom surface 41 of the cover 40, the conductive pads 44 positioned when the cover 40 is in place over the spacer 30, in electrical continuity with the conductive contacts 12 of the individual circuits 10. Conductive paths 46 are likewise deposited on the bottom surface 41 of the cover 40 and positioned for joining at least one of the conductive pads 44 with at least one of the first conductive feedthroughs 42, thereby establishing electrical continuity between the individual circuits 10 and the first conductive feedthroughs 42 whereby the plurality of individual circuits 10 are each sealed and yet made available for electrical interconnection through the conductive feedthroughs 42.

Figure 5:
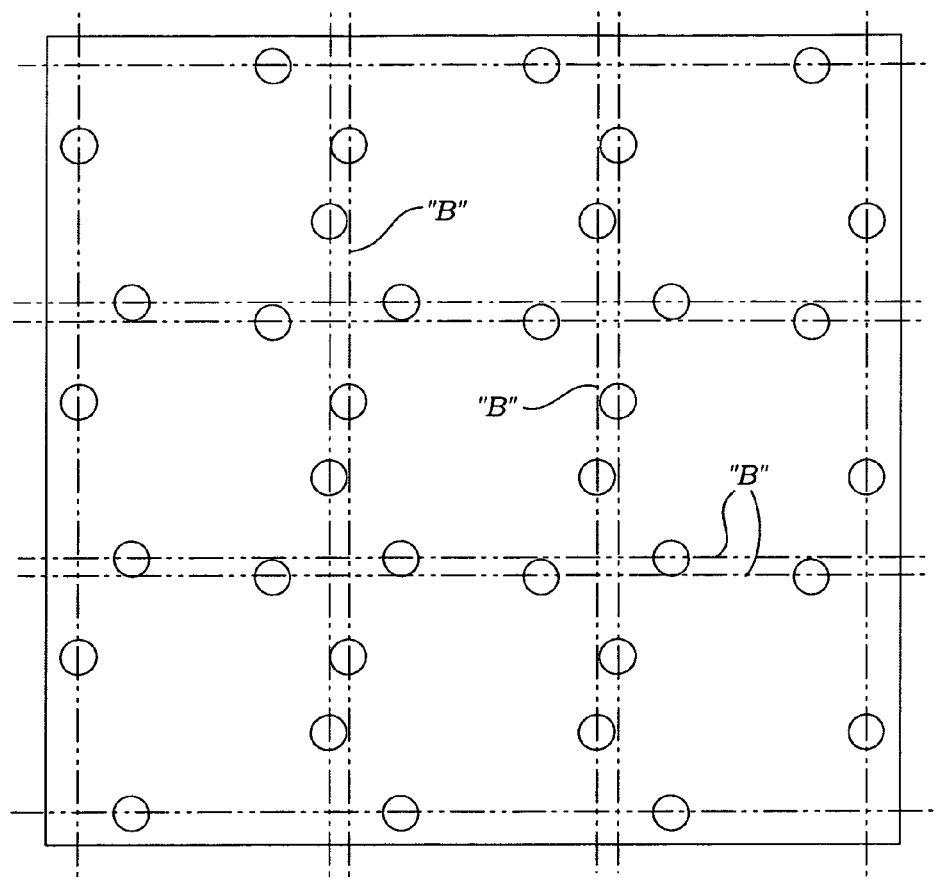
FIG. 5 is a top plan view of the cover of FIG. 4 after assembly with the spacer of FIG. 3 and the substrate of FIG. 2, and showing with phantom lines, the manner of dicing the assembly to produce finished packages.

Preferably, as shown in FIG. 5, the cover 40, spacer 30 and substrate 20 are jointly severed along lines "B" so as to expose the first conductive feedthroughs 42 and to separate the plurality of individual circuits 10

Figure 3:
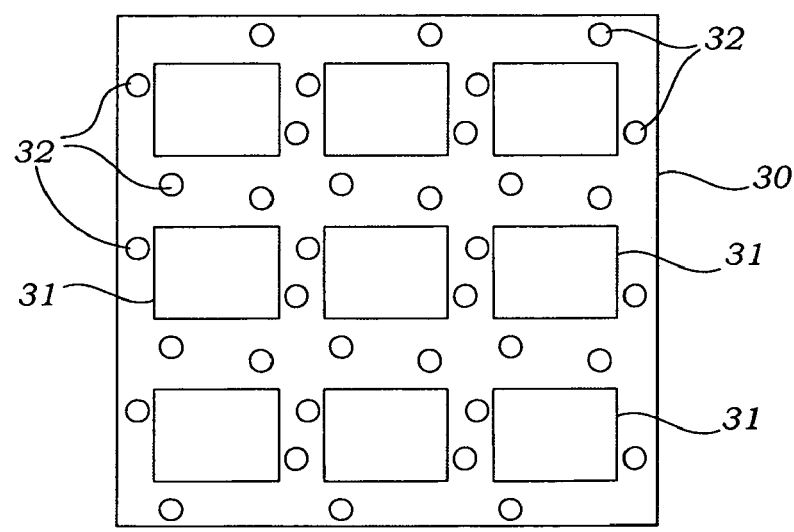
FIG. 3 is top plan view of a spacer for placement in contact with the substrate, the spacer providing rectangular apertures for exposing the devices and round holes for receiving conductive filler.
Figure 4:
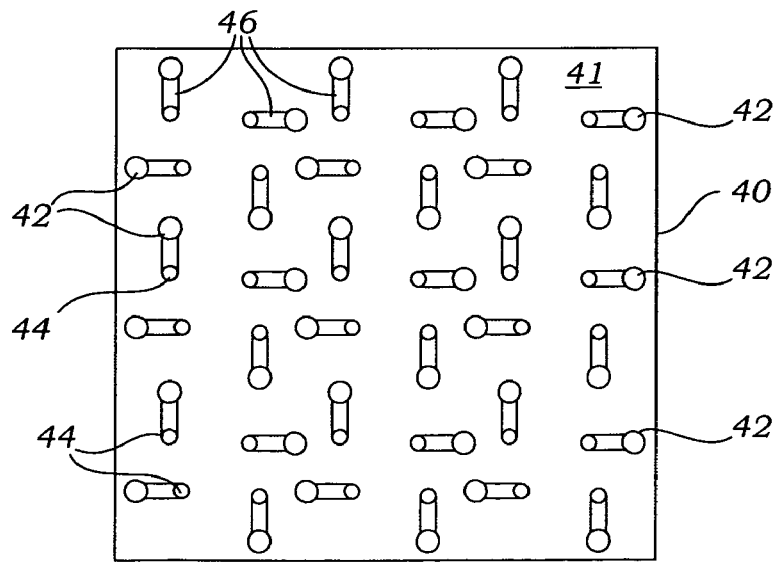
FIG. 4 is bottom plan view of a cover for placement over the spacer, wherein holes therein are in registration with the round holes of the spacer of FIG. 3 and pads (shown as smaller round circles) are in registration with the ball bonds of the devices of FIG. 2, and showing conductive paths between pairs of the round holes and the pads.

Preferably, a plurality of second conductive feedthroughs 32 are formed to penetrate through the spacer 30, as shown in FIG. 3. The second conductive feedthroughs 32 are positioned collinearly with the first conductive feedthroughs 42 and in electrical continuity therewith.

Figure 6:
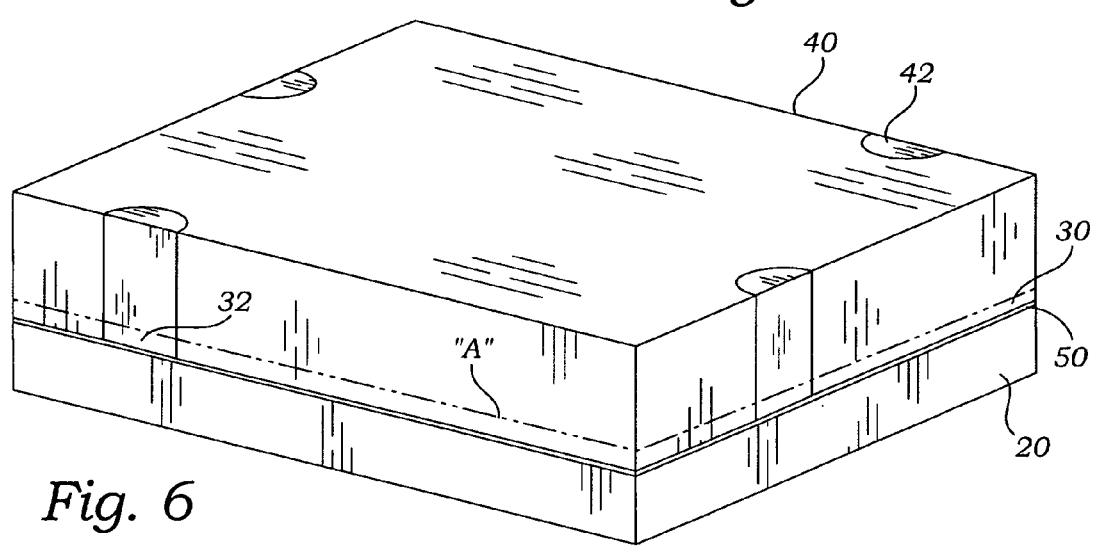
FIG. 6 is a perspective view of one of the finished packages, the cover and the spacer shown as an integral unit on top of the substrate.

Preferably, when the second conductive feedthroughs 32 are present, the cover 40, spacer 30 and substrate 20 are severed so as to expose the first 42 and second 32 conductive feedthroughs and to separate the plurality of individual circuits 10. FIG. 6 shows one of the separated circuits 10 when both feedthroughs 32 and 42 are present.

Preferably, the cover 40 and the spacer 30 are both formed of one of ceramic, glass and plastic; and the cover 40 is made integral with the spacer by one of high temperature ceramic curing, glass frit bonding and epoxy or plastic welding. Alternate joining methods are known in the prior art and would be used by those of skill in the art.

Preferably, the conductive contacts 12 are ball bonds with a height above the substrate 20 that is greater than the thickness of the spacer 30, and the ball bonds are conductively connected to the conductive pads 44 using a high temperature and compression interface.

Preferably, the spacer 30 with the substrate 20 are joined by an anodic bonding interface as is well known in the art, thereby forming a seal against gas transmission such as a hermetic seal.

Preferably, a glass layer 50 is formed on the spacer prior to bonding the spacer to a silicon substrate.

Phantom line "A" shows where the cover 40 and the spacer 30 meet. No discernable separation line usually exists when these two elements are made of ceramic which is fired after holes have been opened for feedthroughs 32 and or 32, 42, and conductive pads 44 and paths 46 have been formed.

The method of fabrication in the above apparatus includes the steps of forming the conductive contacts 12 on each of the individual circuits 10, sealing the spacer 30 to the substrate 20 and then placing the cover 40 over the spacer 30 either before or after making it integral therewith. The method further includes establishing the first conductive feedthroughs 42 through the cover 40, the first conductive feedthroughs being positioned peripheral to each of the individual circuits 10 and forming the conductive pads 44 on the bottom surface 41 of the cover 40. The conductive pads are positioned in registration with and electrical continuity with the conductive contacts 12 of the individual circuits 10. The conductive paths 46 are formed on the bottom surface 41 of the cover 40, the conductive paths 46 each joining at least one of the conductive pads 44 with at least one of the first conductive feedthroughs 42 and this establishes electrical continuity from the individual circuits 10 to the first conductive feedthroughs 42, whereby the plurality of individual circuits 10 are now sealed and available for electrical interconnection through the conductive feedthroughs 42, 32.

Preferably, the step of severing the cover 40, spacer 30 and substrate 20 simultaneously along lines "B" shown in FIG. 5 exposes the first, or the first and second conductive feedthroughs 42, 32 and separates the plurality of individual circuits 10. This may be accomplished by standard dicing techniques well known in the art, and, as discussed, produces encapsulated and sealed packages as shown in FIG. 6.

The enablements described in detail above are considered novel over the prior art of record and are considered critical to the operation of at least one aspect of one best mode embodiment of the instant invention and to the achievement of the above described objectives. The words used in this specification to describe the instant embodiments are to be understood not only in the sense of their commonly defined meanings, but to include by special definition in this specification: structure, material or acts beyond the scope of the commonly defined meanings. Thus if an element can be understood in the context of this specification as including more than one meaning, then its use must be understood as being generic to all possible meanings supported by the specification and by the word or words describing the element.

The definitions of the words or elements of the embodiments of the herein described invention and its related embodiments not described are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the invention and its various embodiments or that a single element may be substituted for two or more elements in a claim.

Changes from the claimed subject matter as viewed by a person with ordinary skill in the art, now known or later devised, are expressly contemplated as being equivalents within the scope of the invention and its various embodiments. Therefore, obvious substitutions now or later known to one with ordinary skill in the art are defined to be within the scope of the defined elements. The invention and its various embodiments are thus to be understood to include what is specifically illustrated and described above, what is conceptually equivalent, what can be obviously substituted, and also what essentially incorporates the essential idea of the invention.

While the invention has been described with reference to at least one preferred embodiment, it is to be clearly understood by those skilled in the art that the invention is not limited thereto. Rather, the scope of the invention is to be interpreted only in conjunction with the appended claims and it is made clear, here, that the inventor(s) believe that the claimed subject matter is the invention.

What is claimed is:

1. An electrical apparatus conductive contacts formed on each of a plurality of individual circuits formed on a substrate; a spacer sealed onto the substrate, the spacer peripherally enclosing each of to individual circuits while exposing the conductive contacts; a cover sealed on the spacer; first conductive feedthroughs penetrating the cover, and positioned peripheral to each of the individual circuits; second conductive feedthroughs through the spacer positioned collinearly with the first conductive feedthroughs and in electrical continuity therewith; conductive pads formed on a bottom surface of the cover, the conductive pads in electrical continuity with the conductive contacts of the individual circuits; conductive paths formed on the bottom surface of the cover, the conductive paths each joining at least one of the conductive pads with at least one of the first conductive feedthroughs thereby establishing electrical continuity between the individual circuits and the first and second conductive feedthroughs; cover, spacer and substrate severed through the first and second conductive feedthroughs thereby separating the individual circuits and establishing a conductive surface on the top and side of the cover and on the side of the spacer at each of the conductive feedthroughs, whereby solder interconnects may be more easily seen on the individual circuit.

2. The apparatus of claim 1 wherein the cover and the spacer are formed of one of ceramic, glass and plastic; and the cover is made integral with the spacer by one of high temperature ceramic curing, glass fit bonding, epoxy bonding and plastic welding.

3. The apparatus of claim 1 wherein the conductive contacts are one of ball bonds and plated metallic bumps, with a height above the substrate greater than a thickness of the spacer, and the ball bonds are conductively connected to the conductive pads using high temperature and compression interface.

4. The apparatus of claim 1 wherein the spacer with the substrate arc joined by anodic bonding interface.

5. The apparatus of claim 4 wherein the spacer provides a glass layer interface with the substrate.

* * * * *